United States Patent [19]

Speer et al.

[11] Patent Number: 5,498,174
[45] Date of Patent: Mar. 12, 1996

[54] ELECTRICAL CONNECTOR WITH SPRING LEG RETENTION FEATURE

[75] Inventors: Richard W. Speer; Edward W. Beiles, both of Kernersville, N.C.

[73] Assignee: The Whitaker Corporation, Wilmington, Del.

[21] Appl. No.: 324,555

[22] Filed: Oct. 18, 1994

[51] Int. Cl.⁶ .................................................. H01R 13/73
[52] U.S. Cl. ........................................ 439/567; 439/751
[58] Field of Search .................................. 439/567, 571, 439/751, 82, 873

[56] References Cited

U.S. PATENT DOCUMENTS

| | | | |
|---|---|---|---|
| 2,754,486 | 7/1956 | Hathorn | 439/55 |
| 2,958,063 | 10/1960 | Stanwyck | 439/82 |
| 4,847,588 | 7/1989 | Doutrich | 439/751 |
| 4,900,276 | 2/1990 | Doutrich | 439/751 |

FOREIGN PATENT DOCUMENTS

| | | |
|---|---|---|
| 2742716 | 5/1979 | Germany . |
| 56-72485 | 6/1981 | Japan . |
| 57-82076 | 5/1982 | Japan . |

*Primary Examiner*—Gary F. Paumen
*Attorney, Agent, or Firm*—Bruce J. Wolstoncroft

[57] ABSTRACT

An electrical connector (2) comprises an insulating housing (4) supporting a row of electrical terminals (6). Each terminal (6) has a mating portion (18) and solder tail (20). The solder tail (20) constructed as a spring leg consists of a first portion (22) for engaging against an internal wall of a hole (H) in a circuit board (PCB) and a second portion (24) for engaging against the bottom edge of the hole (H). The first and second portions (22, 24) of each solder tail (20) are obtusely angled with respect to each other and are connected by a bight (23). The solder tail (20) can be inserted through the hole (H) and the housing (4) rotated on the board PCB so that the solder tail is elastically deformed about the bight (23) and is thereby stressed between the internal wall of the hole (H) and the bottom corner of the hole (H). The connector (2) is thereby firmly secured to the circuit board (PCB) so that the second portion (24) of the solder tail (20) can be wave soldered to a contact pad (CP) on the bottom of the board (PCB). By virtue of the spring leg construction of the solder tail (20) the hole (H) need not be tightly toleranced.

17 Claims, 4 Drawing Sheets

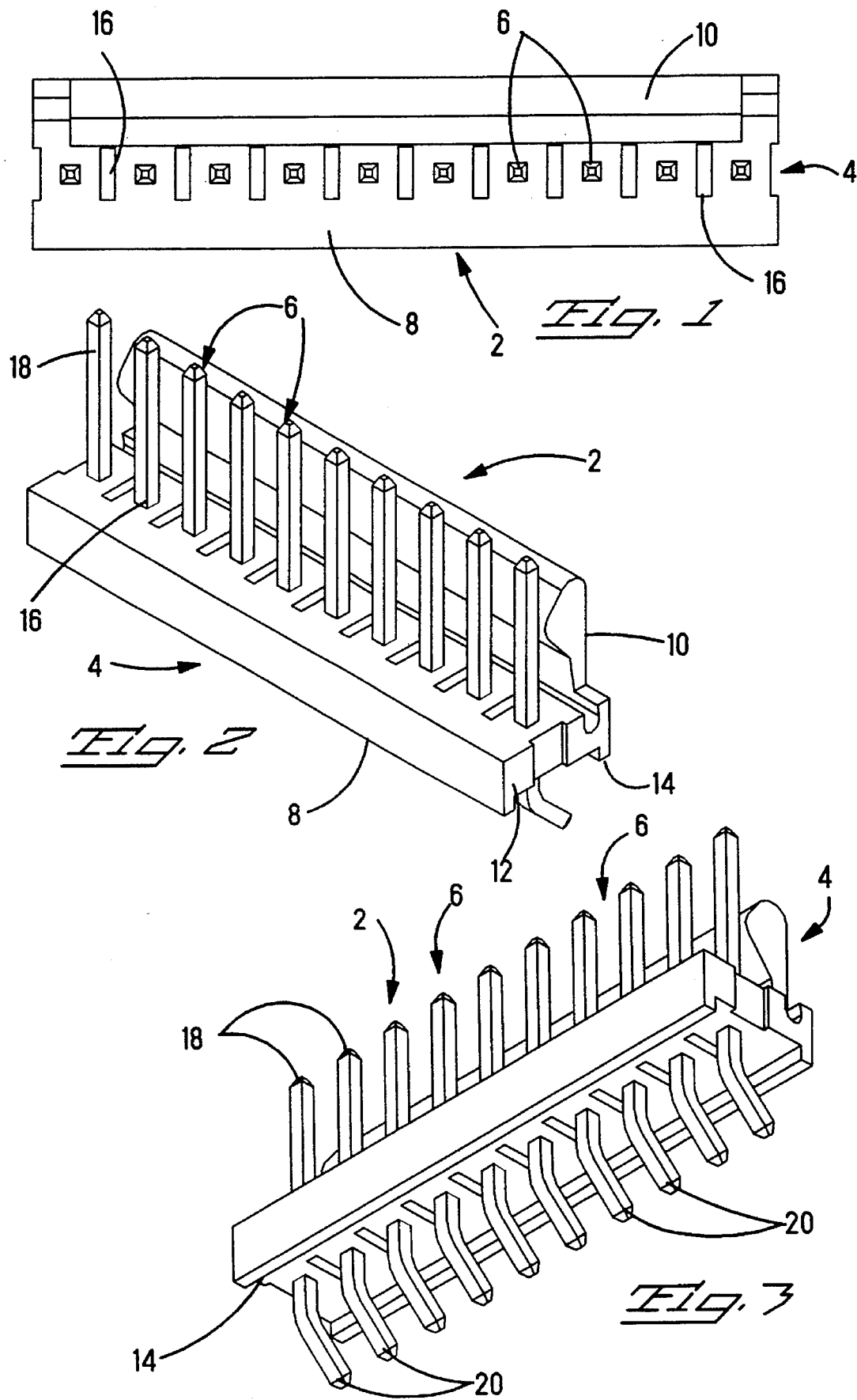

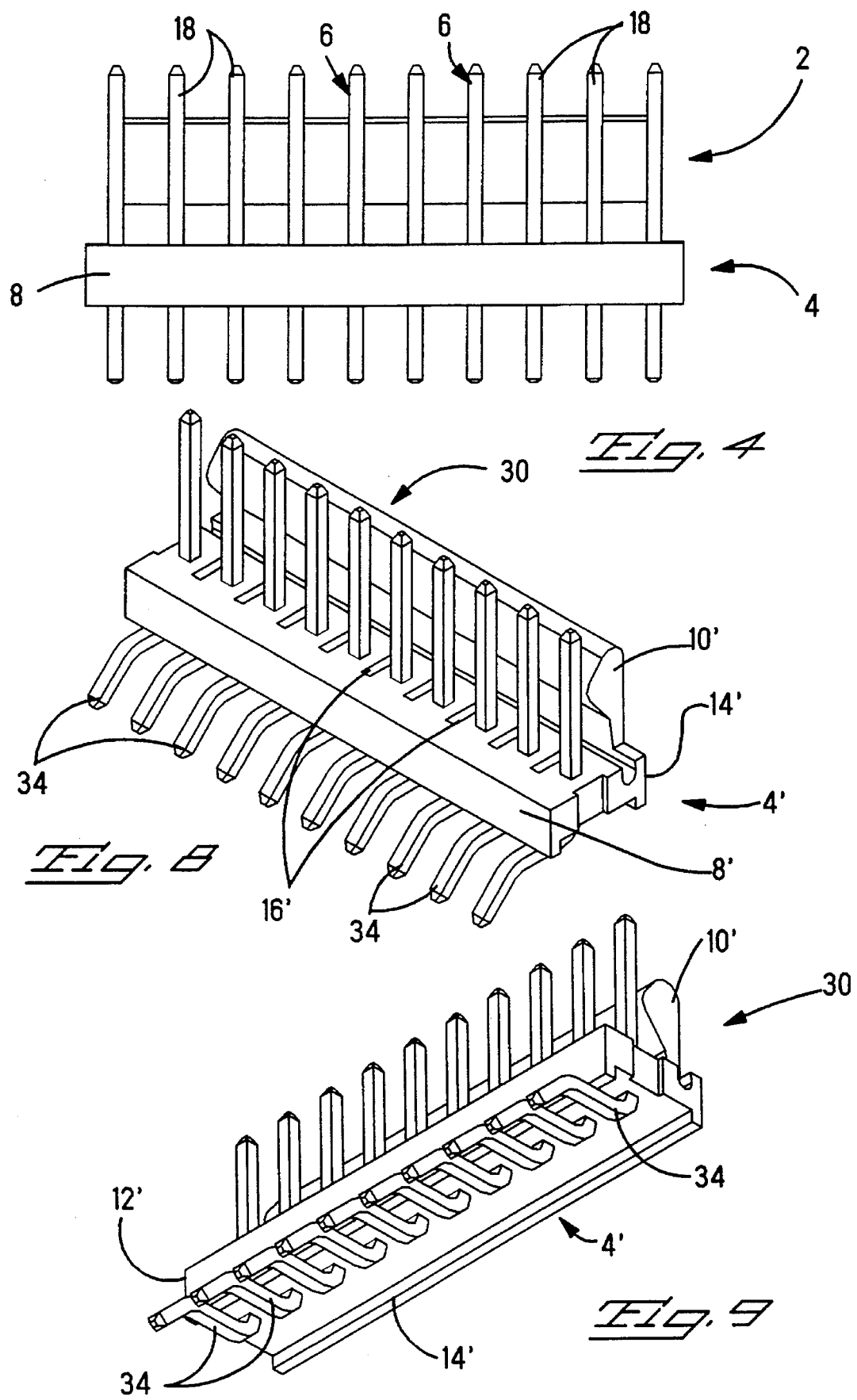

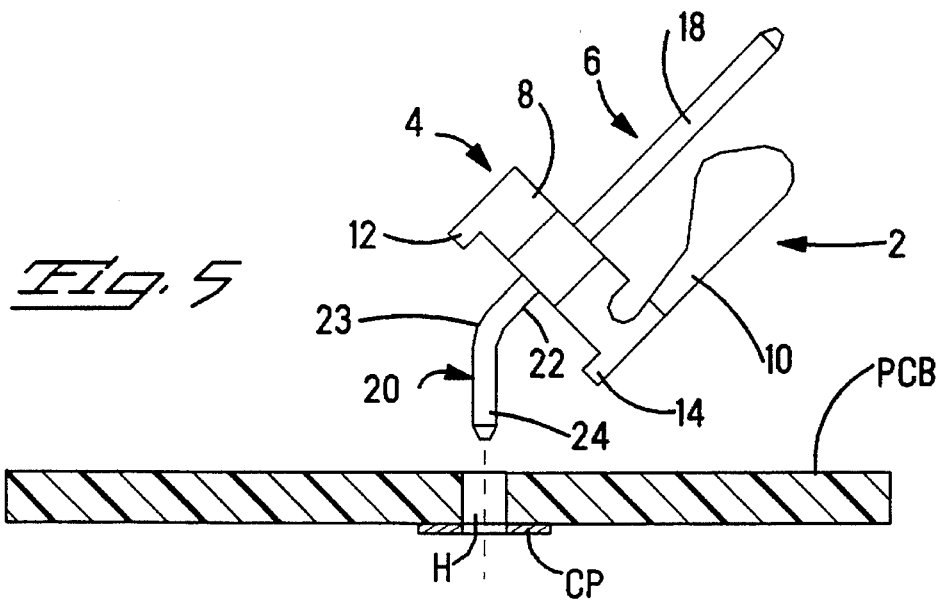
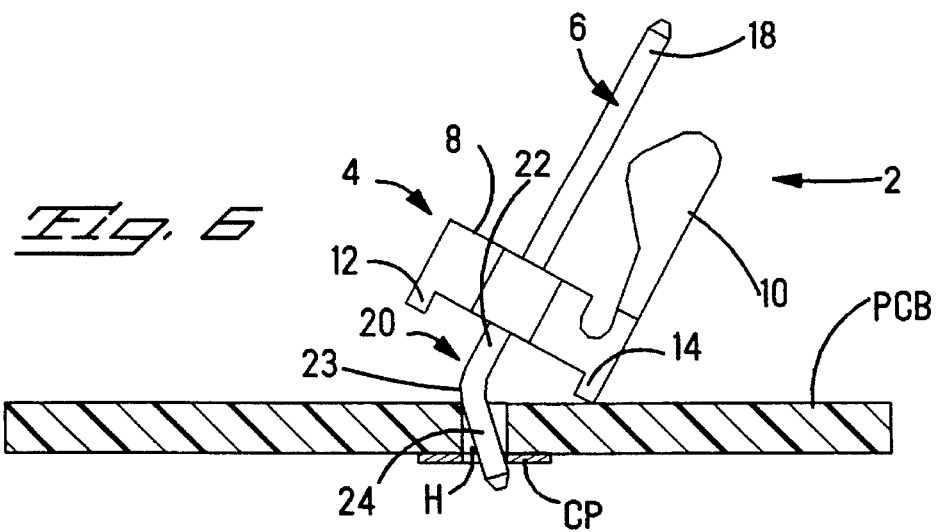
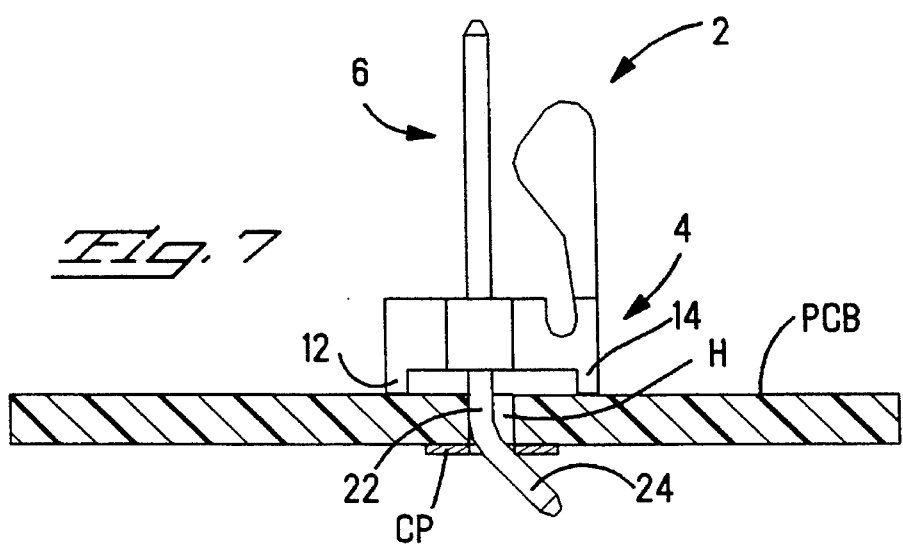

5,498,174

ELECTRICAL CONNECTOR WITH SPRING LEG RETENTION FEATURE

BACKGROUND OF THE INVENTION

This invention relates to electrical connectors for retention on circuit boards and more particularly concerns means for retaining such a connector on a circuit board while solder tails of terminals of the connector are soldered to contact pads on the circuit board.

U.S. Pat. Nos. 4,847,588 and 4,900,276 disclose pin header connectors having terminal pins with means for retaining the header in position on the circuit board while the terminal pins are soldered to the board. Such retention is accomplished by means of an offset formed as a crimp at the insertion end of at least one pair of the terminal pins. The crimps exert opposite normal forces against one surface of their respective holes in the circuit board to retain the header thereon during soldering. In order to provide adequate opposite normal forces, the terminal pins are necessarily thick and stiff. Each terminal pin contacts the one side of the internal wall of its hole and only with the crest of its crimp. The cross sectional dimensions of the holes are critical, if the crimps are not to jam in the holes, especially during robotic assembly of the connectors.

SUMMARY OF THE INVENTION

The present invention is intended to provide means for retaining a connector on a circuit board where, as is usual, the cross sectional dimensions of the holes do not conform to dose tolerances.

According to the present invention, the terminals of an electrical connector for retention on a circuit board are provided with solder tails for insertion through holes in the circuit board. The solder tails are formed as spring legs each having a first abutment portion extending from the housing of the connector for engaging an internal wall of the respective hole, and a second abutment portion connected to the first abutment portion by a bight so as to be obtusely angled, for example by about 150° with respect to the first abutment portion. When the solder tail is inserted through the hole in the circuit board, the second abutment portion engages an edge of the hole at the bottom surface of the circuit board. During insertion of the solder tail through the hole, the solder tail is elastically deformed so that the first abutment portion is urged against internal wall of the hole and the second abutment portion is urged against the edge at the bottom of the hole. The connector is thereby latchingly secured to the circuit board to allow the second abutment portion to be wave soldered (hand or dip soldering may also be performed) to a respective contact pad on the board.

This resilient latching of the connector to the board avoids the need for the holes to be cross sectionally dimensioned to close tolerances. In mounting the connector to the circuit board, the second abutment portion is first inserted through the hole. The connector is rotated on the board so that the solder tail is elastically deformed about the bight whereby the first abutment portion is urged against the internal wall of the hole, while the second abutment portion is urged against the bottom edge of the hole, projecting obliquely from the hole. The crest of the bight does not engage against the internal wall of the hole in the finally mounted position of the connector on the circuit board.

According to one embodiment of the invention, the housing has a pair of stand off ribs both of which engage the board in the finally mounted position of the connector, the rotation of the connector being facilitated by the engagement of a corner of one of the stand off ribs against the board. In this embodiment, the connector is of the vertical type in which a pin or other mating member of each terminal projects vertically from the circuit board when the connector has finally been mounted thereon. In another embodiment, the connector is of the right angle type in which an end of the housing of the connector is applied to the board. In this case, the connector housing may be identical with the housing of the vertical type connector, a corner of one of the stand off ribs being used as a pivot point in rotating the connector relative to the board. In the case of the right angle type connector, the stand off ribs are not otherwise used and indeed, are not needed, since in its fully mounted position, the housing of the connector is clear of the holes in the circuit board and so is undamaged by the soldering heat.

The preferred embodiments of the present invention will now be described by way of example with reference to the accompanying drawings.

BRIEF DESCRIPTION OF THE DRAWINGS

FIG. 1 is a top plan view of an electrical connector in the form of a vertical pin header, according to a first embodiment of the invention;

FIGS. 2 and 3 are isometric views of the vertical pin header taken from above and below, respectively;

FIG. 4 is a side view of the vertical pin header;

FIGS. 5 to 7 are enlarged end views of the vertical pin header showing consecutive steps in mounting it to a printed circuit board which is shown in section;

FIGS. 8 and 9 are isometric views, taken from above and below respectively of an electrical connector in the form of a right angle pin header according to a second embodiment of the invention.

DETAILED DESCRIPTION OF THE PREFERRED EMBODIMENTS

Figure 10:
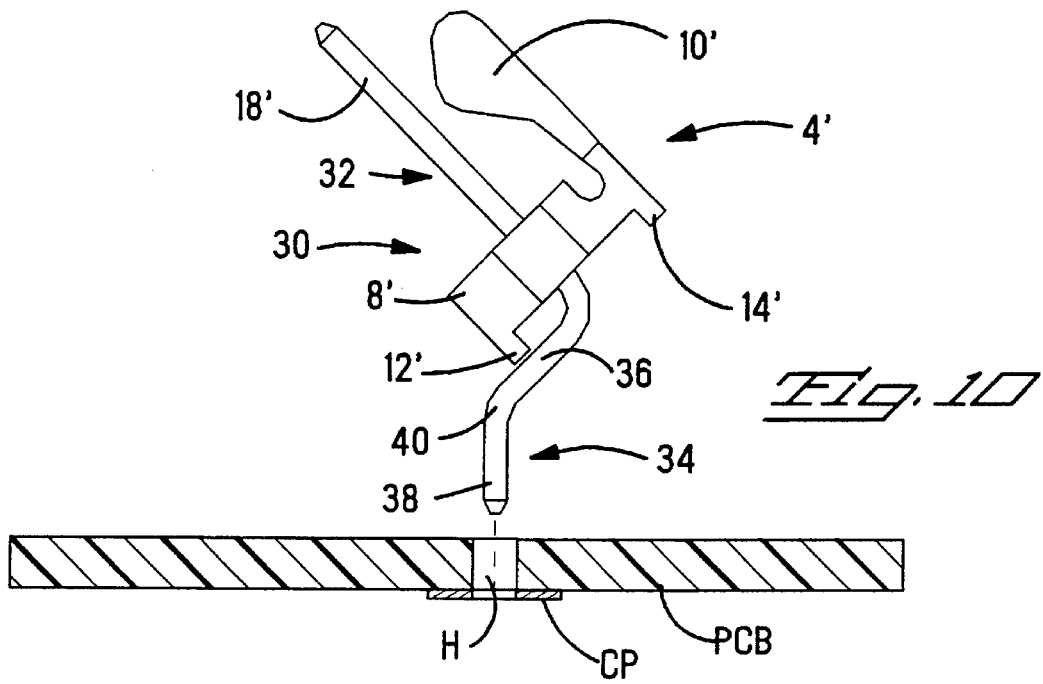
FIGS. 10 to 12 are enlarged end views of the right angle pin header showing consecutive steps in mounting it to a printed circuit board which is shown in section.

As shown in FIGS. 1 to 7, an electrical connector 2 in the form of a vertical pin header comprises a one piece, molded, elongate insulating housing 4 which has been cut from a continuous strip of such housings. In the alternative, the header may be molded to size. The housing 4 supports a row of electrical pin terminals 6 which have been stitched into the housing 4. The terminals may be positioned in the housing utilizing insert molding gang insertion, or other known methods. In the embodiment shown, the housing 4 comprises a generally rectangular, flat, terminal support platform 8 from one longitudinal edge of which upstands a latch arm 10 for latching the connector 2 to a mating receptacle connector (not shown). There depend from opposite longitudinal edges of the platform 8, forward and rear stand off ribs 12 and 14 respectively. Between each pair of adjacent terminals 6, the platform 8 is formed with ventilation through openings 16. Each terminal 6 comprises a mating pin 18 upstanding from the platform 8 and a solder tail 20 depending therebelow. Each solder tail 20, which functions as a spring leg, as described below, comprises a rectilinear (straight) first abutment portion 22 axially aligned with the pin 18 and extending normally of the bottom face of the platform 8 and a rectilinear (straight) second abutment portion which has been obtusely bent through an angle of about 150° rearwardly, with respect to the first abutment portion 22, to produce a shallow bight 23. The abutment portion 24 terminates in the free end of the solder tail 20.

The manner in which the connector 2 is mounted to a printed circuit board PCB, to be latchingly retained thereon to enable the solder tails 20 to be soldered to conductive pads CP (only one of which is shown) on the board PCB will now be described with reference to FIGS. 5 to 7. As will be apparent from FIG. 5, the connector 2 is first positioned above the board PCB with the free end of the abutment portion 24 of each solder tail 20 pointing towards a respective circular cross section through hole H (only one of which is shown) in the board PCB. The connector 2 is then advanced towards the board PCB to the position of FIG. 6 to insert each solder tail 20 partially through a respective hole H so that the bight 23 of the solder tail engages against an upper corner or edge of the hole H and the abutment portion 24 projects through the hole H and engages against the lower edge of the hole H and the respective pad CP. In the position of FIG. 6, the rear corner of the stand off rib 14 contacts the upper surface of the board PCB to provide a pivot point. As will appear from a comparison of FIGS. 6 and 7, the connector 2 is then rotated in a counter clockwise direction about said pivot point until the bottom end of each stand off rib 12 and 14 abuts upper surface of the board PCB. During this rotational movement of the connector 2, the bight 23 slides down the internal surface of the hole H until the corners of the square cross-section of the abutment portion 22 lies in surface to surface engagement with the internal wall and the abutment portion 24, which slides along the lower corner of the hole H projects below the board PCB. If the through hole and/or the solder tail have different cross-sectional configuration, the engagement of the abutment portion with the internal wall may vary. The positions at which the portions 22 and 24 abut the board PCB as described above, are diametrically opposite to each other. During the insertion of the solder tail 20 through the hole H, to the position of FIG. 7, the tail 20 is elastically deformed about the bight 13 and then resiles so that abutment portion 22 is resiliently urged against the internal wall of the hole H and the abutment portion 24 is resiliently urged against said lower edge. The solder tail 20 is thereby stressed between the internal surface of the hole H and said lower edge thereof so that the connector 2 is firmly latched to the board PCB with the pins 18 extending vertically. The abutment portions 24 can now be soldered to their respective pads CP by means of a wave soldering operation, for example, without the risk of the connector shifting relative to the board PCB so as to impair the integrity of the soldered connections. Since the platform 8 is stood off from the board PCB and by virtue of the ventilation openings 16, the housing 4 is undamaged by the soldering heat.

An electrical connector 30 in the form of right angle pin header will now be described with reference to FIGS. 8 to 12 in which parts which are identical with those described above with reference to FIGS. 1 to 7 bear the same reference numerals as in FIGS. 1 to 7 but with the addition of a prime symbol. The housing 4' of the connector 30 is identical with the housing 4 of the connector 2 described above. Each terminal 32 of the connector 30 has a mating pin 18'. In this embodiment, however, the solder tails 34 of the connector 30 differ from the solder tails 20 of the connector 2 of the first embodiment. Each solder tail 34 comprises a rectilinear first abutment portion 36 which extends from the pin 18' in a direction substantially parallel to the bottom face, which in this embodiment is a rear face, of the platform 8' and at right angles to the pin 18'. The abutment portion 36 extends in close proximity to the stand off rib 12'. A second rectilinear abutment portion 38 extends at an obtuse angle, of about 150° with respect to the abutment portion 36 and terminates in the free end of the solder tail 34. The abutment portions 36 and 38 are connected by a shallow bight 40. The abutment portion 36 extends at right angles to the pin 18'.

Figure 11:
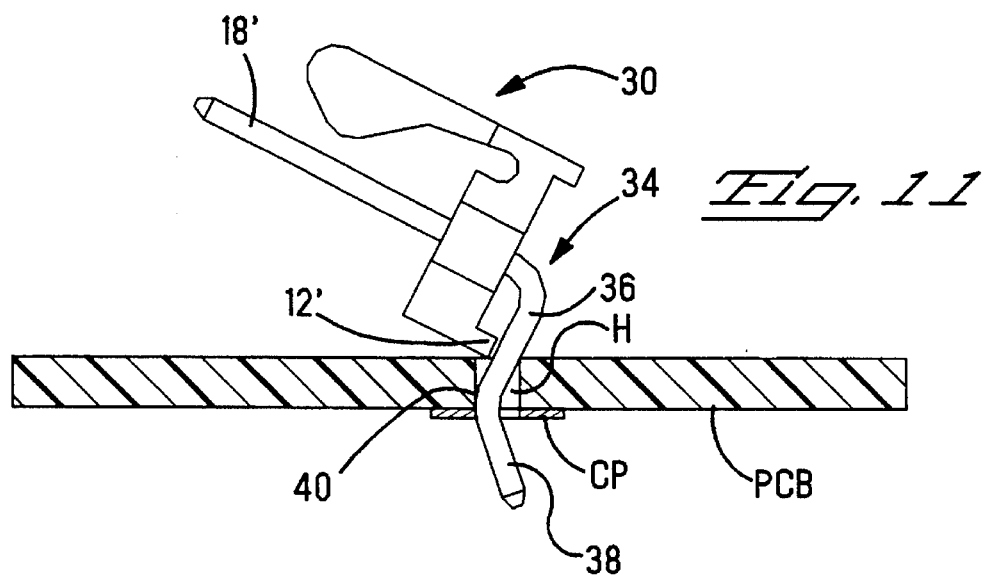
Figure 12:
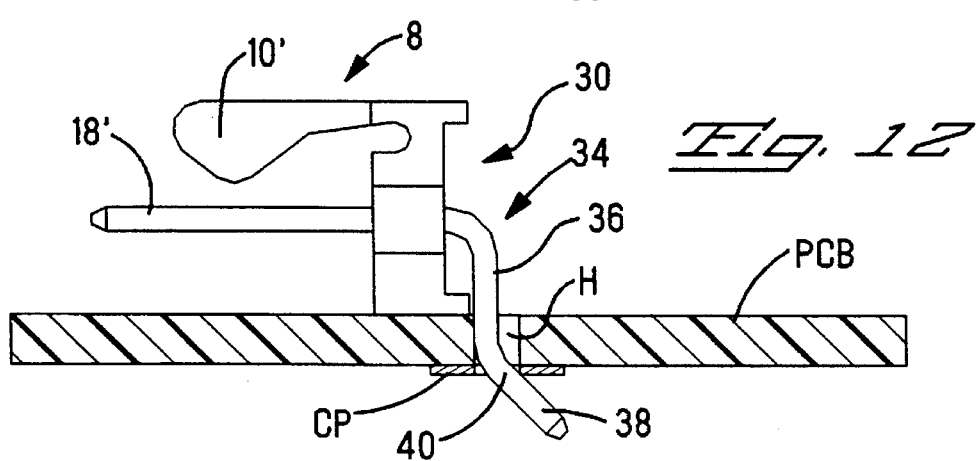

The manner in which the right angle connector 30 is mounted to the printed circuit board PCB to be latchingly retained thereon to enable the abutment portion 38 to be soldered to conductive pads CP (only one of which is shown) on the board PCB will now be described with reference to FIGS. 10 to 12. As will be apparent from FIG. 10, the connector 30 is first positioned above the board PCB with the free end of the abutment portion 38 of each solder tail 34 pointing towards a respective hole 8 (only one of which is shown) in the board PCB. As will be apparent from FIG. 11, the connector 30 is advanced towards the board PCB to insert each solder tail 34 through a respective hole H so that the abutment portion 36 engages the upper edge of the hole H with the bight 40 engaging the internal wall of the hole H at a position diametrically opposite to the point of engagement of the portion 36 with said corner. In the position of FIG. 11 of the connector 30, a forward corner of the forward stand off rib 12' impinges against the upper side of the board PCB and the abutment portion 38 projects below the board PCB from the bight 40. As will appear from a comparison of FIGS. 11 and 12, the connector 30 is now rotated in a counter clockwise direction about said corner of the rib 12' so that in the final position the forward face of the housing 4' lies flat upon the upper side of the board PCB whereby the abutment portion 36 of the tail 34 abuts the internal surface of the hole H and the abutment portion 38 snaps into abutment with the bottom corner of the hole H in the pad CP and still projects below the board PCB, at a position diametrically opposite to the position at which the abutment portion 36 abuts the internal wall of the hole H. Also as will be apparent from FIGS. 11 and 12, each solder tail 34 is elastically deformed about the bight 40 during the mounting of the connector 30 on the board PCB and in the final position of FIG. 12, the solder tail 34 is stressed between the internal wall of the hole H and the bottom edge thereof. The connector is thus firmly latched to the board PCB with the abutment portion 38 of each solder tail in abutment with a respective pad CP for wave soldering thereto. The housing 4' is not damaged by the soldering heat, since it is clear of the hole H. In the position of FIG. 12, the pins 18' and the latch arm 10' project horizontally for mating with a mating connector (not shown) advanced along the board PCB in parallel relationship therewith.

As will be apparent from the above description, the same configuration housing can be used in the production either of the vertical connector 2 or the right angle connector 30.

By virtue of the spring leg feature of the solder tails, the retention of the connectors on circuit boards does not require the holes to be produced to tight tolerances.

The invention is not restricted to pin header connectors but may also be applied to other connectors which are to be mounted on printed circuit boards, for example, receptacle connectors having mating members in the form of sockets rather than pins.

What is claimed is:

1. An electrical connector for retention on a circuit board having first and second opposite sides, the connector comprising an insulating housing supporting a plurality of electrical terminals having solder tails extending from the housing for insertion through in the circuit board from the first side thereof, the solder tails each being formed as a spring leg having a first abutment portion extending from the housing for engaging an internal wall of the hole and a second abutment portion connected to the first abutment portion by a bight so as to be obtusely angled with respect to the first abutment portion, for engaging an edge of the hole defined by the second side of the circuit board, the solder tail being elastically deformable about the bight by rotational motion of the housing on the circuit board, to urge the first abutment portion against the internal wall of the hole and the second abutment portion against said edge, the second abutment portions of the solder tails of the terminals all extending in the same direction.

2. A connector as claimed in claim 1, wherein the first and second abutment portions are straight.

3. A connector as claimed in claim 2, wherein the first and second abutment portions are angled by about 150° with respect to each other.

4. A connector as claimed in claim 1, wherein the housing has a top face, and a bottom face with stand off projections for engaging the first side of the circuit board, the first abutment portion depending from the bottom face of the housing at right angles to the bottom face, a mating member connected to the contact tail, upstanding from the top face of the housing.

5. A connector as claimed in claim 4, wherein the housing is rotatable with respect to the circuit board, with one of the stand-off projections in contact with the first side of the circuit board, to urge the bight against the internal wall of the hole.

6. A connector as claimed in claim 1, wherein the housing has a first face for engaging the first side of the circuit board and a second face extending transversely of the first face, the first abutment portion of the solder tail extending from the second face transversely of, and beyond, the first face, a mating member connected to the solder tail projecting from the housing in parallel relationship with the first face.

7. A connector as claimed in claim 6, wherein the first face of the housing has a projection extending towards the first abutment portion, the housing being rotatable with respect to the circuit board, with the projection in contact with said one side of the circuit board, to urge the bight against the internal wall of the hole.

8. An electrical connector secured to a first side of a circuit board having first and second opposite sides, the connector comprising an insulating housing engaging the first side of the circuit board and supporting a plurality of electrical terminals each having a resilient solder tail extending through a hole in the circuit board, the solder tail having a first abutment portion abutting an internal wall of the hole and a second abutment portion connected to the first abutment portion by a bight and extending from the bight at an obtuse angle with respect to the first abutment portion and beyond the second side of the circuit board, the second abutment portion resiliently abutting a corner of the hole, defined by the second side of the circuit board, whereby the solder tail is stressed between said internal wall and said corner securely to latch the connector to the circuit board.

9. A connector as claimed in claim 8, wherein said abutment portions are angled by about 150° with respect to each other.

10. A connector as claimed in claim 8, wherein the second abutment portion engages said corner substantially midway along the length of the second abutment portion.

11. A connector as claimed in claim 8, wherein the first abutment portion abuts said internal wall at a position diametrically opposite to the point of abutment of the second abutment portion with said corner.

12. A connector as claimed in claim 8 wherein the housing supports a row of said terminals, the second abutment portion of the solder tails of the terminals all extending in the same direction.

13. A connector as claimed in claim 8, wherein the housing supports a row of said terminals, the housing engaging the circuit board by way of a pair of spaced stand-off ribs between which the solder tails of the terminals extend, a mating member of each terminal extending from the housing perpendicularly with respect to the circuit board, the housing being formed with ventilation through holes located between the terminals.

14. A connector as claimed in claim 8, wherein the housing supports a row of said terminals, the housing having first and second opposite sides and first and second opposite ends, the first end of the housing engaging the circuit board, a mating member of each terminal being connected to the first abutment portion, which extends at right angles to the mating member, the mating member projecting from the second side of the housing parallel with the circuit board.

15. A pin header connector for retention on a circuit board having holes therethrough, the connector comprising an insulating housing having first and second opposite sides, and a row of electrical pin terminals secured in the housing, each pin terminal having a pin projecting from the first side of the housing and having a longitudinal axis, and a solder tail formed as a spring leg depending from the second side of the housing, each solder tail having a first rectilinear abutment portion extending from the second side of the housing normal thereto for engaging an internal wall of a respective hole in the circuit board, each terminal further having a second abutment portion for engaging a portion of the hole and being connected to the first abutment portion by a bight so as to be obtusely angled with respect to the first abutment portion, a first standoff rib projecting from the second side of the housing along one side of the solder tails and a second stand-off rib projecting from the second side of the housing on the opposite side of the solder tails to the first standoff rib, the first abutment portions of the solder tails projecting from the second side of the housing, the second abutment portion of each terminal extending laterally beyond the longitudinal axis of the pin of that terminal, the second abutment portions of the solder tails of the terminals all extending in the same direction.

16. A connector as claimed in claim 15, wherein the first and second abutment portions of each solder tail are angled by about 150° with respect to each other.

17. A pin header electrical connector for retention on a circuit board having holes therethrough, the connector comprising an insulating housing having first and second opposite sides and an end face for engaging the circuit board, and a row of electrical pin terminals secured in the housing, each pin terminal having a pin projecting from the first side of the housing and having a longitudinal axis, and a solder tail formed as a spring leg depending from the second side of the housing, each solder tail having a first abutment portion extending from the second side of the housing in substantially parallel relationship with the second side of the housing and beyond said end face of the housing, for engaging an internal wall of a respective hole in the circuit board and a second abutment portion for engaging a corner of the hole and being connected to the first abutment portion by a bight so as to be obtusely angled with respect to the first abutment portion, the first abutment portion of the solder tail of each terminal extending at right angles to the pin of that terminal, the second abutment portions of the solder tails of the terminals all extending in the same direction.

* * * * *